United States Patent
Powell et al.

(10) Patent No.: US 8,922,155 B2
(45) Date of Patent: Dec. 30, 2014

(54) MONITORING MOTOR CONDITION

(71) Applicants: Joe Powell, Garland, TX (US); Randall L. Lisbona, Coppell, TX (US)

(72) Inventors: Joe Powell, Garland, TX (US); Randall L. Lisbona, Coppell, TX (US)

(73) Assignee: Lennox Industries Inc., Richardson, TX (US)

(*) Notice: Subject to any disclaimer, the term of this patent is extended or adjusted under 35 U.S.C. 154(b) by 200 days.

(21) Appl. No.: 13/710,211

(22) Filed: Dec. 10, 2012

(65) Prior Publication Data

US 2014/0159635 A1  Jun. 12, 2014

(51) Int. Cl.
| | |
|---|---|
| *H02P 23/00* | (2006.01) |
| *G01R 31/34* | (2006.01) |
| *H02K 11/00* | (2006.01) |
| *F04D 27/00* | (2006.01) |
| *G01M 13/00* | (2006.01) |
| *G01M 13/04* | (2006.01) |
| *F04D 25/08* | (2006.01) |

(52) U.S. Cl.
CPC ............ *G01M 13/00* (2013.01); *G01R 31/343* (2013.01); *H02K 11/0015* (2013.01); *F04D 27/001* (2013.01); *G01M 13/04* (2013.01); *F04D 25/08* (2013.01)
USPC .............. 318/799; 318/400.01; 318/400.14; 318/400.1; 318/779; 318/490

(58) Field of Classification Search
USPC ............ 318/400.01, 400.1, 400.14, 400.13, 318/599, 700, 701, 721, 779, 799, 266, 268, 318/430, 432, 490; 388/819, 909, 838
See application file for complete search history.

(56) References Cited

U.S. PATENT DOCUMENTS

| 5,621,159 A | 4/1997 | Brown et al. |
|---|---|---|
| 7,322,799 B2 * | 1/2008 | Robertson et al. .............. 417/16 |

FOREIGN PATENT DOCUMENTS

| DE | 102008009612 A1 | 8/2009 |
|---|---|---|
| DE | 102008047026 A1 | 3/2010 |
| FR | 2872573 A1 | 1/2006 |

OTHER PUBLICATIONS

PCT International Search Report for related PCT/US2013/071748, dated Feb. 19, 2014, 5 pages.
PCT Written Opinion of the International Search Authority for related PCT/US2013/071748, dated Feb. 19, 2014, 6 pages.
Abstract DE 102008009612 A1, obtained from Espacenet on Apr. 10, 2014, 1 page.
Abstract DE 102008047026 A1, obtained from Espacenet on Apr. 10, 2014, 1 page.
Abstract FR 2872573 A1, obtained from Espacenet on Apr. 10, 2014, 1 page.

* cited by examiner

*Primary Examiner* — Antony M Paul
(74) *Attorney, Agent, or Firm* — Klemchuk Kubasta LLP; Elizabeth Philip Dahm; Shannon W. Bates

(57) ABSTRACT

In various implementations, a condition of a motor may be monitored based at least partially on time required to achieve a change in speed. A notification may be transmitted based on the condition of the motor.

20 Claims, 2 Drawing Sheets

MONITORING MOTOR CONDITION

TECHNICAL FIELD

The present disclosure relates to monitoring motor condition.

BACKGROUND

Motors, such as fan motors used in air conditioners, heat pumps, refrigeration units and/or other types of systems, may be subject to various stresses. For example, the motor and/or components of the motor may be subject to thermal, dynamic, and/or static loading; vibration; shock; and/or other environmental, mechanical, and/or electrical stresses. The motors can fail as a result of being subject to these stresses. For example, the stator, rotor, bearings, and/or shaft in the motor may fail. Often, motor failure may come without warning.

SUMMARY

In various implementations, a method for monitoring a condition of a motor may include determining a first period of time for a motor of a fan to operate. The motor may change a speed from a first speed to a second speed during the first period of time, and the first speed and/or the second speed may be zero revolutions per minute. The first period of time and a predetermined period of time may be compared, and a condition of the motor may be determined based at least partially on the comparison between the first period of time and the predetermined period of time.

Implementations may include one or more of the following features. In some implementations, the motor may be allowed to operate, and determining the first period of time may include determining a start-up period of time. In some implementations, the motor may be allowed to operate, and determining the first period of time may include determining a wind down period of time. Determining the first period of time for the motor of the fan to operate may include using a sensor coupled to the motor to determine the first period of time. Second period(s) of time for a motor to operate may be determined and at least one of the second periods of time may be associated with a change in speed of the motor between at least one of zero revolutions per minute and a second speed or the second speed and zero revolutions per minute. The predetermined period of time may be determined based at least partially on one or more of the second periods of time. In some implementations, the predetermined period of time may be adjusted based at least partially on the determined first period of time, and additional first period(s) of time may be determined. One or more of the additional first periods of time may be associated with a change in motor speed between zero revolutions per minute and a second speed and/or the second speed and zero revolutions per minute. A notification may be transmitted based at least partially on the determined condition of the motor. In some implementations, one or more operating properties of the motor may be determined, and determining a condition of the motor may be further based at least partially on the determined operating property(ies).

In various implementations, a first period of time may be determined for a motor of a fan to operate, and the motor may operate between a first speed and a second speed during the first period of time. The first period of time and a predetermined period of time may be compared, and a condition of the motor may be determined based at least partially on the comparison between the first period of time and the predetermined period of time.

Implementations may include one or more of the following features. A notification may be transmitted based at least partially on the determined condition of the motor. A notification may be automatically transmitted when a condition of the motor is within a predetermined range. The predetermined range may be approximately a predetermined percentage of the predetermined period of time, and a notification may be automatically transmitted when the first period of time is less than the predetermined range.

In various implementations, a system may include fan assembly(ies). The fan assembly(ies) may include a fan that includes fan blades, a motor, and a controller. The motor may be coupled to the fan and may rotate the fan blades of the fan. The controller may determine a condition of the motor based at least partially on the comparison between one or more first periods of time and a predetermined period of time. At least one of the first periods of time may be associated with a change in motor speed from approximately zero and a predetermined speed and/or the predetermined speed and zero.

Implementations may include one or more of the following features. The system may include an air conditioner that includes one or more of the fan assemblies. The system may include a heat pump that includes one or more of the fan assemblies. The system may include a refrigeration unit that includes one or more of the fan assemblies. In some implementations, the system may include speed sensor(s) coupled to the fan assembly, and determining at least one first period of time is based at least partially on measurements of at least one of the speed sensors. The controller may transmit a notification based at least partially on the condition of the motor. The controller may determine the predetermined period of time based at least partially on previously determined first period(s) of time. In some implementations, the controller may determine a condition of the motor based at least partially on one or more operating properties of one or more of the fan assemblies.

The details of one or more implementations are set forth in the accompanying drawings and the description below. Other features, objects, and advantages of the implementations will be apparent from the description and drawings.

BRIEF DESCRIPTION OF THE DRAWINGS

For a more complete understanding of this disclosure and its features, reference is now made to the following description, taken in conjunction with the accompanying drawings, in which.

Like reference symbols in the various drawings indicate like elements.

DETAILED DESCRIPTION

In various implementations, motors may be utilized to rotate a fan in different types of systems, such as an air conditioning system (e.g., oil based systems, gas based systems, electric systems, heating systems, cooling systems, outdoor units, indoor units, and/or portions thereof, such as air handlers, heat exchangers, furnaces, and/or other portions of a heating and/or air conditioning system), a refrigeration system (e.g., combined units, indoor units, outdoor units, and/or portions thereof), and/or a heat pump system, for example.

The motor may include several components that may wear and malfunction and/or fail. In various implementations, a condition of the motor may be monitored and a notification may be transmitted based at least partially on the monitoring of the motor. Thus, in some implementations, a user may have advance warning of a poor condition of a motor (e.g., excessive wear, potential failure of a component, and/or excessive friction in moving parts). The user may then proactively replace and/or repair parts, as appropriate, to inhibit unexpected reduced capacity, malfunction, and/or catastrophic failure of a motor.

Figure 1:
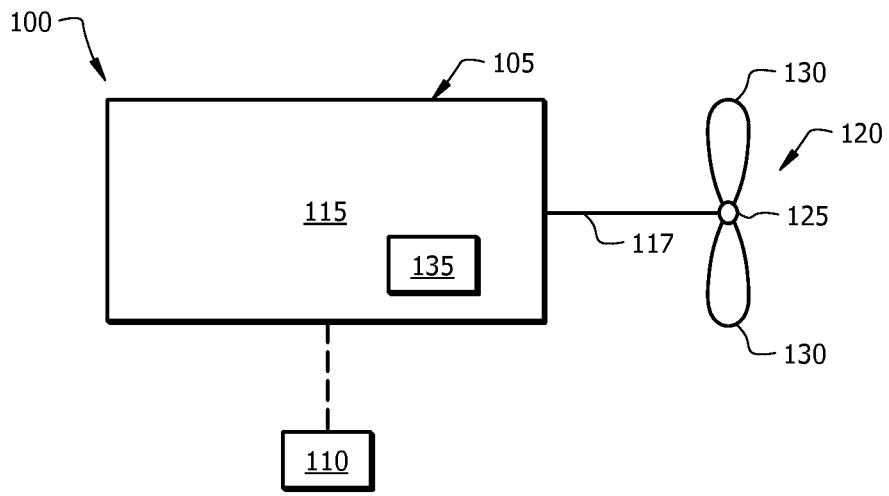
FIG. 1 illustrates an implementation of an example fan assembly.

FIG. 1 illustrates an implementation of a portion of an example system 100 (e.g., air conditioners such as oil, gas, and/or electric air conditioners; oil heaters; gas heaters; electric heaters; air handling units; furnaces; refrigeration units; heat pumps, and/or portions thereof). The system 100 may include a fan assembly 105, sensor(s) 135, and a controller 110.

As illustrated, the fan assembly 105 may include a fan 120 and a motor 115. The fan 120 may include a hub 125 and fan blades 130. The motor 115 may be any appropriate type of motor for the system 100. For example, the motor 115 may comprise an electromechanical motor having a stator, a rotor, bearings, and/or a shaft 117. As illustrated, the motor 115 may be coupled to the hub 125 of the fan 120 via the motor shaft 117. In operation, the motor 115 may provide rotational energy to the fan 120 to rotate the fan blades 130 and generate airflow. In some implementations, the fan assembly 105 may be coupled to heat exchangers and provide airflow through the heat exchangers.

The system 100 may further include sensor(s) 135. The sensors 135 may be any appropriate type of sensor for the system 100, such as speed sensors, timers, thermometers, and/or ice sensors, for example. The sensor(s) 135 may be coupled to the motor 115 and/or to the fan 120 to monitor properties, such as speed(s) and/or period(s) of time, for example. The sensor(s) 135 may be coupled to the controller 110, and the sensor(s) 135 may provide data on the monitored properties to the controller 110.

The controller 110 may be any appropriate computer or programmable logic device for the system 100. The controller 110 may control the motor 115, the fan 120, the sensor(s) 135 and/or other components of the system 100. The controller 110 may include a memory that stores data, such as predetermined periods of time, predetermined speeds, functions and/or statistical models for determining predetermined periods of time based on monitored properties, measured periods of times, measured speeds, measured operational parameters, predetermined ranges for operational parameters, notification properties, and/or any other appropriate data.

The memory of controller 110 may also store instructions, such as operation systems and/or other applications. For example, the memory of controller 110 may store one or more modules to perform various operations of the system 100. In some implementations, a condition module may monitor one or more properties (e.g., speed, time, and/or operational properties), determine and/or retrieve predetermined values for properties, determine a condition of a motor, and/or transmit notifications.

The controller 110 may include a processor to execute various instructions and/or applications. For example, the processor of controller 110 may execute the condition module to perform the operations of the module. The controller 110 may include a communication interface to communicate with various components of the system 100, such as the motor 115, the fan 120, the sensor(s) 135 and/or other components. The controller 110 may include a presentation device to facilitate presentation of information and/or one or more input devices to facilitate the entry of information.

Although a specific implementation of a portion of an example system 100 is illustrated, other systems may be utilized as appropriate. For example, the controller 110 may be coupled to various other components of the system 100 and control operations and/or monitor various properties of the components through a management module. The motor 115 and the fan 120 may be disposed in the same housing. Although a directly driven fan is illustrated in FIG. 1, other types of direct drive fans and/or indirect drive fans (e.g., using belt pulleys) may be utilized. The fan may be any appropriate type of fan or air moving apparatus, such as a blower, centrifugal fan, axial fan, etc.

During system operations, the motor 115 may operate according to instructions from the controller 110. However, if the motor 115 or parts thereof fail, then operation of the system 100 may be restricted. For example, if the motor 115 on a fan 120 of the system 100 fails (e.g., the bearings fail), then operation of a heat exchanger to which the fan 120 provides airflow may be restricted. In some implementations, failure of a component such as a motor 115 may cause wear and/or failure of other components of the system 100 (e.g., running the heat exchanger without providing adequate air flow may damage the heat exchanger). Thus, in some implementations, if a condition of a motor is monitored, a motor and/or components thereof may be replaced and/or repaired prior to failing.

Figure 2:
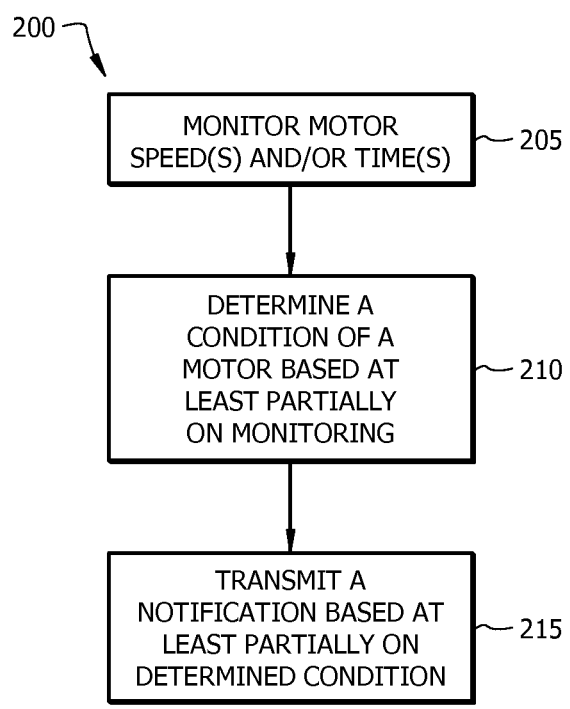
FIG. 2 illustrates an implementation of an example process for monitoring a condition of a motor.

FIG. 2 illustrates an implementation of an example process 200 for monitoring a condition of a motor. A condition of a motor may be classified into condition levels, such as positive or negative; good or poor; normal, poor, or very poor, etc. A condition of a motor in a condition level, such as poor motor condition may indicate that a motor may fail. A good condition may indicate that a motor may continue to operate (e.g., until a poor condition notification is received).

The motor speed(s) and/or time(s) may be monitored (operation 205). For example, a period of time for a motor to change speeds between a first speed and a second speed may be determined by monitoring motor speed(s) and/or times. In some implementations, during operation of a system, a controller may alter a speed of a motor (e.g., from a first speed to a second speed, from zero to a second speed, and/or from a first speed to zero). The controller and/or sensors may then monitor and/or determine the motor speed(s) and/or time(s) associated with the motor speed(s).

A condition of the motor may be determined based at least partially on the monitoring (operation 210). In some implementations, as a motor operates, stress on the motor and/or the fan may cause the motor and/or components of the motor to wear. For example, the bearings may gradually wear out. In some implementations, an amount of lubricant may be reduced during use and cause wear on the components of the motor. As the motor or components of the motor wear, the rate at which the motor may change speeds may be affected. Thus, in some implementations, monitoring the rate at which a motor is able to change speeds may provide a quantitative indication of the condition of the motor.

A notification may be transmitted based at least partially on the determined condition (operation 215). For example, the notification may indicate a condition of the motor. For example, the notification may include a green light when the condition of the motor is good and a red light when the condition of the motor is poor. As another example, the notification may include communication signals to a user via a device, such as a controller and/or a smart phone. The notification may include auditory, tactile, and visual communication signals, such as sounds, vibrations, and/or notices on a graphical user interface (e.g., on a device such as a user control device located in a building).

Process 200 may be implemented by various systems, such as system 100. In addition, various operations may be added, deleted, and/or modified. For example, the notification may be transmitted when the condition of the motor is poor (e.g., based on predetermined quantitative standards) and transmission of the notification may be restricted when the condition of the motor is not poor.

Figure 3:
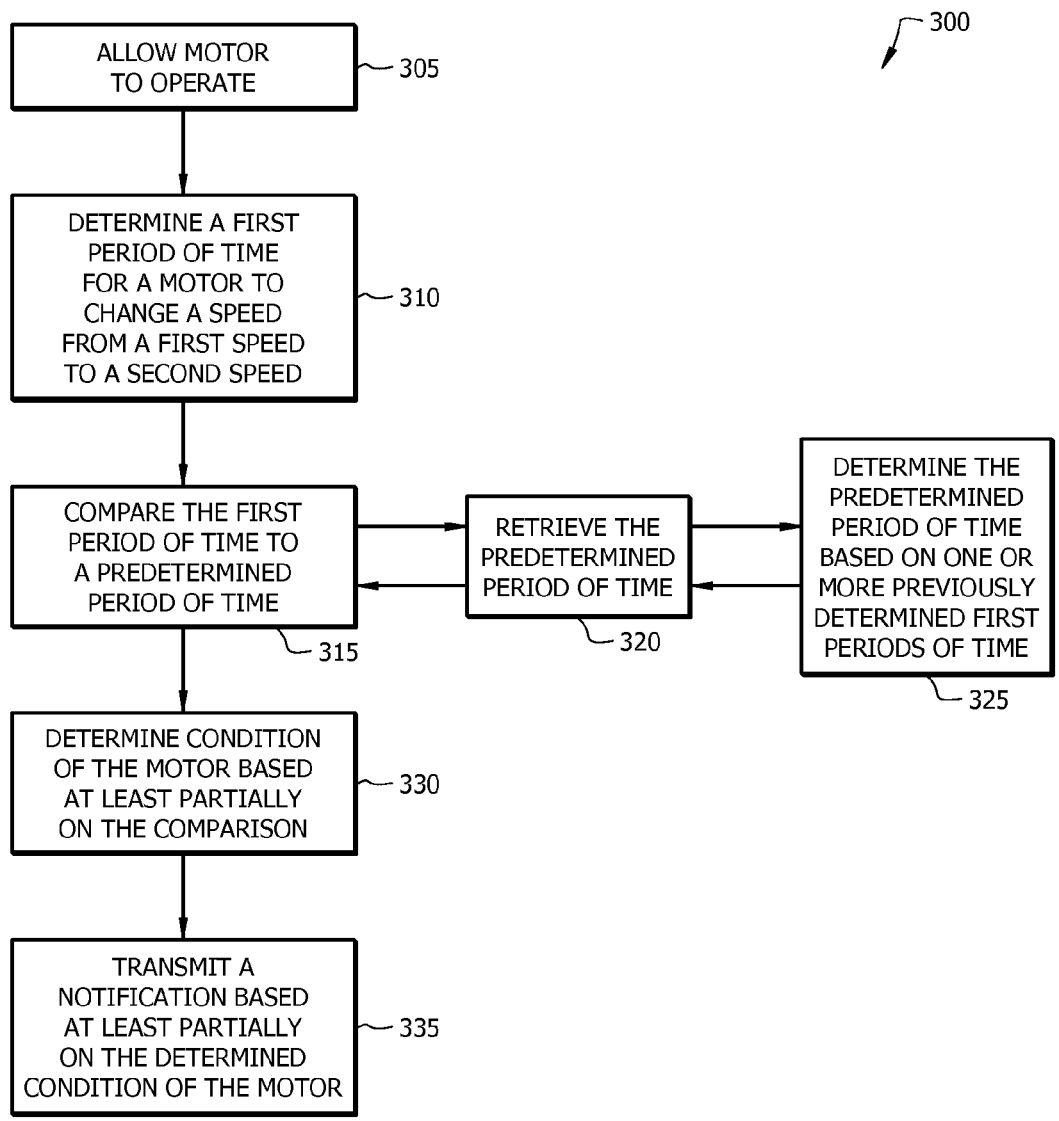
FIG. 3 illustrates an implementation of an example process for monitoring a condition of a motor.

FIG. 3 illustrates an implementation of an example process 300 for monitoring a condition of a motor. A motor may be allowed to operate (operation 305). For example, a system such as an air conditioning system may operate in heating and/or cooling modes and utilize a fan in conjunction with a heat exchanger to provide hot and/or cold air to a location. The motor may rotate the blades of a fan to provide air flow over a coil of a heat exchanger that condenses and/or evaporates a refrigerant.

Various properties of the system may be monitored. In some implementations, a first period of time for a motor to change a speed from a first speed to a second speed may be determined (operation 310). For example, sensor(s) may measure rotations of a shaft of a motor and/or rotation of fan blade(s) over a time period to determine a speed of a motor. In some implementations, a sensor within the motor may measure a motor speed and the controller may determine the times the motor achieves a predetermined speed.

The first period of time and a predetermined period of time may be compared (operation 315). The predetermined period of time may be based at least partially on: previously determined first periods of time (e.g., similar first periods of time based on operating properties), predetermined first periods of time associated with similar motors, and/or a value from a look-up table (e.g., based on historical data for similar motors).

To perform the comparison (operation 315), a predetermined period of time may be retrieved (operation 320). For example, the controller may retrieve the predetermined period of time from a memory coupled to the system.

In some implementations, the retrieved predetermined period of time (operation 320) may be determined based on one or more previously determined first period(s) of time (operation 325). For example, statistical models and/or formulas (e.g., average and/or statistical models for forecasting) may be applied to previously determined first periods of time to determine the predetermined period of time.

A condition of the motor may be determined at least partially based on the comparison (operation 330). In some implementations, the condition of the motor may be classified qualitatively in a condition level, for example, good or poor, when the first period of time falls within a predetermined range. The predetermined range may be a predetermined percentage of the predetermined period of time. For example, when the first period of time is less than approximately half of the predetermined period of time, a condition of the motor may be classified as poor. In some implementations, the controller may classify the motor condition among several condition levels that correlate to percentages of the predetermined period of time. For example, when the first period of time is less than approximately one quarter of the predetermined period of time, a condition of the motor may be classified as very poor.

A notification may be transmitted based at least partially on the determined condition of the motor (operation 335). For example, the controller may transmit an auditory, tactile, and/or visual notification based on the condition of the motor.

For example, a notification may be transmitted to a presentation interface of a user device to indicate the condition of the system and/or motor in a condition level (e.g., good or poor). In some implementations, the notification may be transmitted when the condition of the motor is in one or more of the condition levels and transmission of the notification may be restricted when the condition of the motor is within one or more other condition levels.

Process 300 may be implemented by various systems, such as system 100. In addition, various operations may be added, deleted, and/or modified. In some implementations, process 300 may be performed in combination with other processes, such as process 200. For example, process 200, process 300, and/or portions thereof may be implemented by a system that includes an air conditioner or portions thereof. The fan may be a portion of the indoor unit, the outdoor unit, an air handler, a furnace, etc. In some implementations, process 200, process 300, and/or portions thereof may be implemented by a system that includes a refrigeration unit. The fan of the system may be a portion of the indoor unit and/or the outdoor unit.

In some implementations, the predetermined period of time may not be determined from previously determined first periods of time per operation 325. The predetermined period of time may be a value provided to the controller (e.g., by a technician and/or based on data for similar motors).

In some implementations, the predetermined period of time may be determined based on previously determined first periods of time for the motor during a set time period. For example, the controller may monitor the first periods of time for the first six months of operation and utilize these values as a base predetermined period of time. In some implementations, the controller may monitor the first periods of time for one year after the first month of operation. Adjustment of the base predetermined period of time may be restricted after the set time period.

In some implementations, the first period of time may correlate to a start up and/or wind-down period of operation. For example, the amount of time that a motor takes to start up (e.g., for a speed of a motor to change from approximately zero to a second speed) may be measured and/or stored in a memory coupled to the system. In some implementations, the amount of time that a motor takes to wind-down (e.g., for the speed of a motor to change from a first speed to approximately zero) may be measured and/or stored in a memory coupled to the system. Thus, during normal operations of the system, the motor may be turned on and off and the start up and/or wind-down periods may be monitored during the normal operations. The data from monitoring speed and/or time during the normal operations may be utilized to monitor the condition of the motor.

In some implementations, the condition of the motor may be further based at least partially on operational properties. For example, operational properties such as temperature, icing, and/or season may be monitored. The motor may operate differently at different temperatures, when ice is present proximate the system, and/or during different seasons (e.g., during periods of extreme weather conditions). The controller may monitor the operational properties (e.g., through sensors and/or through weather reports). The controller may modify the predetermined period of time and/or retrieve the appropriate predetermined period of time based on the monitoring of one or more of the operational properties. For example, when ice is present proximate the motor, the motor may wind-down more quickly. The controller may monitor whether ice is present using an ice sensor and/or a thermometer and retrieve the predetermined period of time appropriate for when ice is present.

Example 1

An air conditioner may include a fan assembly having a motor and a fan that runs at two speeds, zero and 850 RPM. When the motor is initially installed in the air conditioner, a test run may be performed. The test run may determine one or more periods of time for one or more test start-ups and/or wind-downs. In some implementations, the test run may be based on 6 months of operations of the air conditioner. The data from the test run may be utilized to determine the value for the predetermined period of time (e.g., 5 seconds) associated with start-up and/or wind-down. The air conditioner may then be allowed to operate (e.g., based at least partially on user requests for operation) and the period of time for start-up and/or wind-down may be monitored. The controller may determine the condition of the motor based on the monitored values.

When the monitored period of time for the start-up and/or wind-down is in a first predetermined range (e.g., approximately 1.25 to approximately 2.5 seconds), then the condition of the motor may be classified as poor. The first predetermined range may be approximately half of the value for the predetermined period of time (e.g., that was determined based on the test run). When the condition of the motor is determined, a notification may be transmitted (e.g., a message transmitted to a user device, such as a text message or message on a controller). In some implementations, a notification of the condition of the motor may be transmitted when measured, when the condition level changes, and/or when the condition level is in one or more of the condition levels (e.g., poor and/or very poor).

The controller may continue to monitor the period of time for start-up and/or wind-down and may continue to determine the condition of the motor. In some implementations, a second notification may be transmitted when the condition of the motor is determined to be in a second predetermined range (e.g., approximately one quarter of the value for the predetermined period of time, approximately 1.25 seconds).

End of Example 1

Although a specific controller has been described in FIG. 1, the controller may be any appropriate computer or other programmable logic device. The controller may include a processor that executes instructions and manipulates data to perform operations of the controller. The processor may include a programmable logic device, a microprocessor, or any other appropriate device for manipulating information in a logical manner and memory may include any appropriate form(s) of volatile and/or nonvolatile memory, such as RAM and/or Flash memory.

In addition, various software may be stored on the memory. For example, instructions (e.g., operating systems and/or other types of software), a condition module, and/or management module may be stored on the memory. In some implementations, modules may be combined, such as into a single module or multiple modules. Condition modules and management modules may be distinct modules. In an implementation, condition modules and/or management modules may include various modules and/or sub-modules.

A communication interface may allow the controller to communicate with components of the system, other repositories, and/or other computer systems (e.g., for weather reports). The communication interface may transmit data from the controller and/or receive data from other components, other repositories, and/or other computer systems via network protocols (e.g., TCP/IP, Bluetooth, and/or Wi-Fi) and/or a bus (e.g., serial, parallel, USB, and/or FireWire). Operations of the system stored in the memory may be updated and/or altered through the communication interface via network protocols (e.g., remotely through a firmware update and/or by a device directly coupled to the controller).

The controller may include a presentation interface to present data to a user, such as though a monitor and/or speakers. The presentation interface may facilitate receipt of requests for operation from users.

A client (e.g., control panel in a field or building) may allow a user to access the controller and/or instructions stored on the controller. The client may present notifications from the controller. The client may be a computer system such as a personal computer, a laptop, a personal digital assistant, a smart phone, or any computer system appropriate for communicating with the controller. For example, a technician may utilize a client, such as a tablet computer, to access the controller. As another example, a user may utilize a client, such as a smart phone, to access the controller, request operations, and/or receive notifications.

Although FIG. 1 provides one example of a controller that may be used with the system, controller can be implemented through computers such as servers, as well as through a server pool. For example, controller may include a general-purpose personal computer (PC) a Macintosh, a workstation, a UNIX-based computer, a server computer, or any other suitable device. According to one implementation, controller may include a web server. Controller may be adapted to execute any operating system including UNIX, Linux, Windows, or any other suitable operating system. The controller may include software and/or hardware in any combination suitable to provide access to data and/or translate data to an appropriate compatible format.

Various implementations of the systems and techniques described herein can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system, including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the term "machine-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

Although users have been described as human, a user may be a person, a group of people, a person or persons interacting with one or more computers, and/or a computer system.

It is to be understood that the implementations are not limited to the particular systems or processes described which may, of course, vary. It is also to be understood that the terminology used herein is for the purpose of describing particular implementations only, and is not intended to be limiting. As used in this specification, the singular forms "a", "an" and "the" include plural referents unless the content clearly indicates otherwise. Thus, for example, reference to "a motor" includes a combination of two or more motors and reference to "an operational property" includes different types and/or combinations of operational properties. As another example, "coupling" includes direct and/or indirect coupling of members.

Although the present disclosure has been described in detail, it should be understood that various changes, substitutions and alterations may be made herein without departing from the spirit and scope of the disclosure as defined by the appended claims. Moreover, the scope of the present disclosure is not intended to be limited to the particular implementations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding implementations described herein may be utilized according to the present disclosure. Accordingly, the appended claims are intended to include within their scope such processes, machines, manufacture, compositions of matter, means, methods, or steps.

The invention claimed is:

1. A method for monitoring a condition of a motor, the method comprising:
   determining a first period of time for a motor of a fan to operate, wherein the motor changes speed from a first speed to a second speed during the first period of time, and wherein at least one of the first speed or the second speed comprises zero revolutions per minute;
   comparing the first period of time and a predetermined period of time; and
   determining a condition of the motor based at least partially on the comparison between the first period of time and the predetermined period of time.

2. The method of claim 1 further comprising allowing the motor to operate, and wherein determining the first period of time comprises determining a start-up period of time.

3. The method of claim 1 further comprising allowing the motor to operate, and wherein determining the first period of time comprises determining a wind down period of time.

4. The method of claim 1 further comprising:
   monitoring one or more second periods of time for a motor to operate, wherein at least one of the second periods of time is associated with a change in speed of the motor between at least one of zero revolutions per minute and a second speed or the second speed and zero revolutions per minute; and
   determining the predetermined period of time based at least partially on one or more of the second periods of time.

5. The method of claim 1 wherein determining the first period of time for the motor of the fan to operate comprises using a sensor coupled to the motor to determine the first period of time.

6. The method of claim 1 further comprising adjusting the predetermined period of time based at least partially on the determined first period of time; and determining one or more additional first periods of time; wherein one or more of the additional first periods of time are associated with a change in motor speed between at least one of:
   zero revolutions per minute and a second speed or
   the second speed and zero revolutions per minute.

7. The method of claim 1 further comprising transmitting a notification based at least partially on the determined condition of the motor.

8. The method of claim 1 further comprising determining one or more operating properties of the motor, and wherein determining a condition of the motor is further based at least partially on one or more of the determined operating properties.

9. A method for monitoring a condition of a motor, the method comprising:
   determining a first period of time for a motor of a fan to operate, wherein the motor operates between a first speed and a second speed during the first period of time;
   comparing the first period of time and a predetermined period of time; and
   determining a condition of the motor based at least partially on the comparison between the first period of time and the predetermined period of time.

10. The method of claim 9 further comprising transmitting a notification based at least partially on the determined condition of the motor.

11. The method of claim 9 further comprising automatically transmitting a notification when a condition of the motor is within a predetermined range.

12. The method of claim 11 wherein the predetermined range comprises approximately a predetermined percentage of the predetermined period of time, and wherein a notification is automatically transmitted when the first period of time is less than the predetermined range.

13. A system comprising:
   one or more fan assemblies comprising:
      a fan comprising fan blades; and
      a motor coupled to the fan, wherein the motor rotates the fan blades of the fan; and
   a controller adapted to:
      determine a condition of the motor based at least partially on the comparison between one or more first periods of time and a predetermined period of time, wherein at least one of the first periods of time is associated with a change in motor speed from at least one of approximately zero and a predetermined speed or the predetermined speed and zero.

14. The system of claim 13 further comprising an air conditioner, wherein the air conditioner comprises one or more of the fan assemblies.

15. The system of claim 14 further comprising one or more speed sensors coupled to the fan assembly, wherein determining at least one first period of time is based at least partially on measurements of at least one of the speed sensors.

16. The system of claim 14 wherein the controller is further adapted to transmit a notification based at least partially on the condition of the motor.

17. The system of claim 14 wherein the controller is further adapted to determine the predetermined period of time based at least partially on one or more previously determined first periods of time.

18. The system of claim 14 wherein the controller is further adapted to determine a condition of the motor based at least partially on one or more operating properties of one or more of the fan assemblies.

19. The system of claim 13 further comprising a heat pump, wherein the heat pump comprises one or more of the fan assemblies.

20. The system of claim 13 further comprising a refrigeration unit, wherein the refrigeration unit comprises one or more of the fan assemblies.

* * * * *